United States Patent [19]

Howard et al.

[11] Patent Number: 5,014,420

[45] Date of Patent: May 14, 1991

[54] FUSING TOGETHER METAL PARTICLES USING A HIGH-FREQUENCY ELECTROMAGNETIC FIELD

[75] Inventors: Thomas A. Howard, Minneapolis; Donovan E. McGee, Northfield, both of Minn.

[73] Assignee: XPC, Incorporated, Burnsville, Minn.

[21] Appl. No.: 378,086

[22] Filed: Jul. 11, 1989

[51] Int. Cl.⁵ .......................... H05K 3/02; B05B 5/025
[52] U.S. Cl. ....................................... 29/846; 118/623; 219/10.65; 219/10.67; 219/121.12; 219/121.35; 427/47; 427/96
[58] Field of Search ...................... 29/846; 219/121.35, 219/121.12, 10.57, 10.65, 10.67, 10.79; 118/623; 427/47,96

[56] References Cited

U.S. PATENT DOCUMENTS

| | | | |
|---|---|---|---|
| 3,491,236 | 1/1970 | Newberry | 219/121.12 X |
| 4,159,414 | 6/1979 | Suh et al. | 219/121.35 X |
| 4,361,114 | 11/1982 | Gurev | 219/121.12 X |
| 4,788,396 | 11/1988 | Maugein et al. | 219/10.57 X |

FOREIGN PATENT DOCUMENTS

| | | | |
|---|---|---|---|
| 2548243 | 8/1976 | Fed. Rep. of Germany | 118/623 |
| 60-218826 | 11/1985 | Japan | 427/47 |
| 742119 | 6/1980 | U.S.S.R. | 427/47 |
| 2160712 | 12/1985 | United Kingdom | 29/846 |

OTHER PUBLICATIONS

IBM Tech. Discl. Bull. vol. 11, No. 11, Apr. 1969, p. 1449 by F. A. Karner et al.

Primary Examiner—P. W. Echols
Assistant Examiner—Carl J. Arbes
Attorney, Agent, or Firm—Jacobson and Johnson

[57] ABSTRACT

Micro-miniature particles of low resistivity material are fused by applying a highly concentrated high-frequency electromagnetic field to the particles. An electrially conductive printed circuit is formed by laying out a pattern of contiguous micro-miniature particles of low resistivity material and applying a highly concentrated high-frequency electromagnetic field to the particles to fuse them together to form a low resistance electrical conductive circuit.

11 Claims, 3 Drawing Sheets

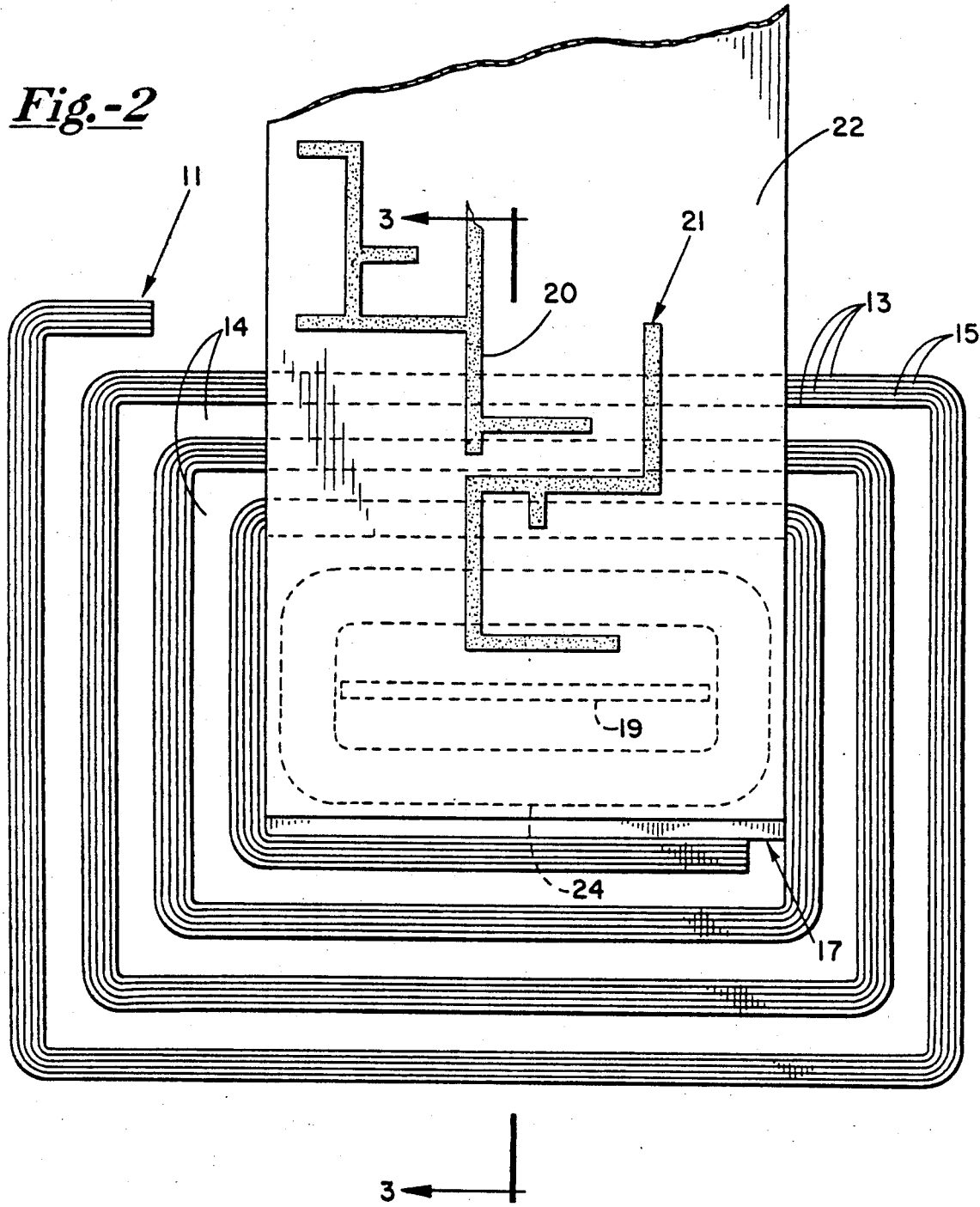

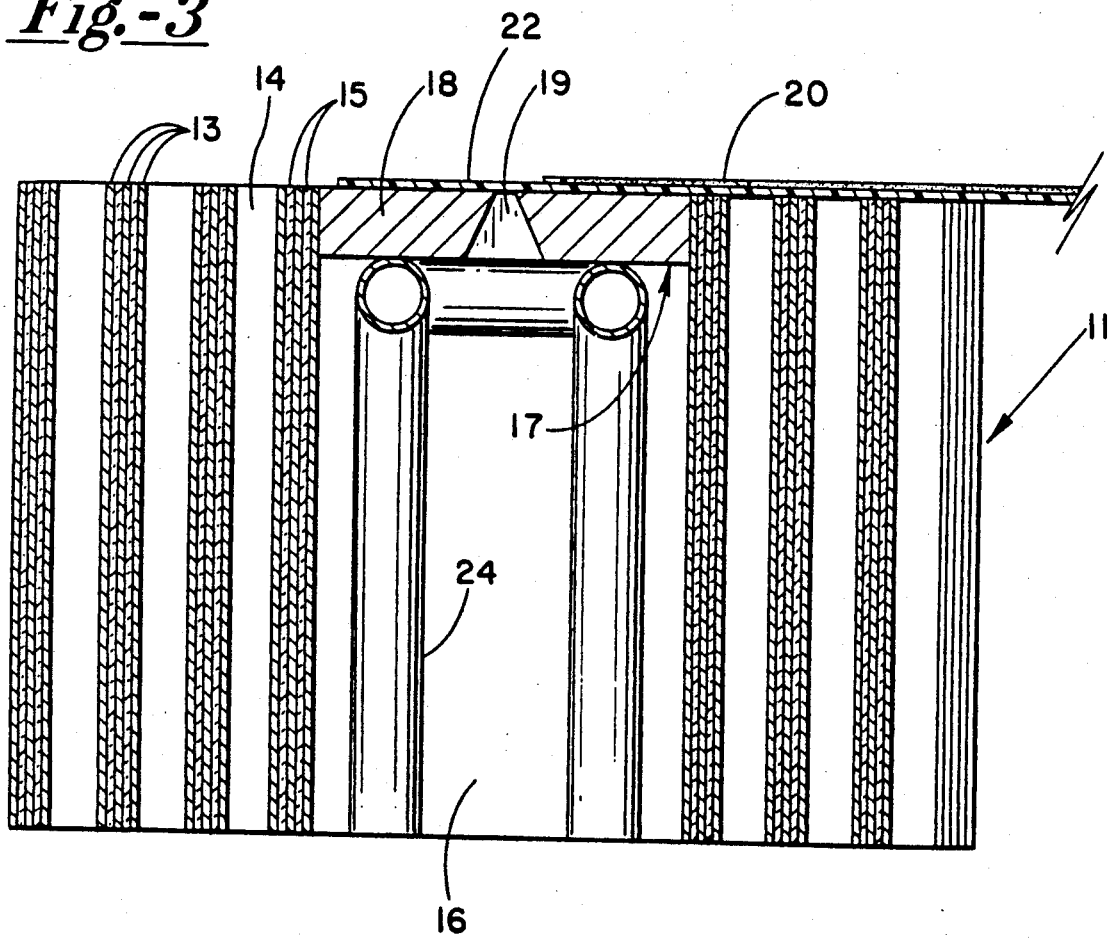

FUSING TOGETHER METAL PARTICLES USING A HIGH-FREQUENCY ELECTROMAGNETIC FIELD

BACKGROUND OF THE INVENTION

In general, the invention is directed toward fusing or melting low resistivity micro-miniature particles of electrically conductive material. More specifically, the invention is directed toward forming a low resistance electrical conductor such as an electrical printed circuit by applying to a pattern of contiguous, low resistivity, micro-miniature particles of electrically conductive material, a highly concentrated high-frequency electromagnetic field to fuse the particles together.

DESCRIPTION OF THE PRIOR ART

Present day technology for making printed circuit boards, for the most part, involves a process of photographically laying out an electrical circuit pattern on a sheet of copper (or other suitable electrically conductive material) which is on a supporting insulating layer or substrate and then chemically etching away that portion of the copper which is not part of the circuit so that what remains is the desired electrical circuit. Although processes have been developed for recovering the etched copper and disposing of the chemical etchant, there still is a great deal of waste of material and pollution control problems in handling and disposing of the etchant.

SUMMARY OF THE INVENTION

A multitude of micro-miniature particles of a material with low electrical resistivity, such as copper (sometimes hereinafter referred to as powdered copper or powdered metal) is layed out in a contiguous pattern corresponding to the pattern of the desired electrical circuit on a thin insulating layer or substrate. The substrate is moved through an intense concentrated high-frequency magnetic field in such a way that the plane of the substrate is substantially perpendicular to the direction of magnetic flux. This flux provides the energy to melt the particles and thus fuse them together into continuous electrical conductors.

The magnetic flux is generated by causing a high-frequency current to flow in a coil. This current can be provided by a conventional high frequency power source such as a Colpitts oscillator. The coil is part of the tuned circuit required by the Colpitts oscillator. A flux concentrator is placed at one end of the core of the coil to substantially close the magnetic flux path at the end of the core except for a very narrow slot opening. This causes the magnetic flux generated by the coil to be highly concentrated at the slot opening. Preferably the flux concentrator is in the form of a slab of highly conductive material, such as copper. The copper slab resists the penetration of magnetic flux due to eddy currents. The eddy currents generate heat in the concentrator which should be removed to protect the concentrator and the substrate. This can be done by circulating cold water, cryogenic liquids, or the like through suitably formed channels in the concentrator. In operation the patterned particles on the substrate are positioned as close as possible to the opening in the flux concentrator. Preferably the particles are electrically insulated from the flux concentrator. The substrate is moved across the very narrow opening in the flux concentrator in such a way that it is substantially perpendicular to the high frequency magnetic field issuing from the opening.

The materials commonly used for substrate normally can withstand the temperatures of most molten metals for very short times. By cooling, the flux concentrator provides a cold surface very close to the fused particles, so the heat of melting is rapidly removed from the fused metal after it emerges from the high magnetic field. This minimizes the effects of the elevated temperatures on the substrate.

At the temperatures attained in this process, most commonly used circuit materials react readily with the oxygen in the air. To minimize or eliminate this, a blanket of reducing gas is provided over the melting and cooling zones. This gas can be any combustible gas such as hydrogen, carbon monoxide, propane or the like or it can be a mixture of inert and reducing gases such as hydrogen and argon or the like.

Circuits formed in this fashion do not require any chemical etchant thereby eliminating pollution problems attendant to disposing the etchant. Unfused copper particles can be easily recovered thereby minimizing waste.

BRIEF DESCRIPTION OF THE DRAWING

FIG. 2 is a top plan view of a coil suitable for use in the instant invention; and FIG. 3 is a vertical section view of FIG. 2.

DESCRIPTION OF THE PREFERRED EMBODIMENTS

Figure 1:
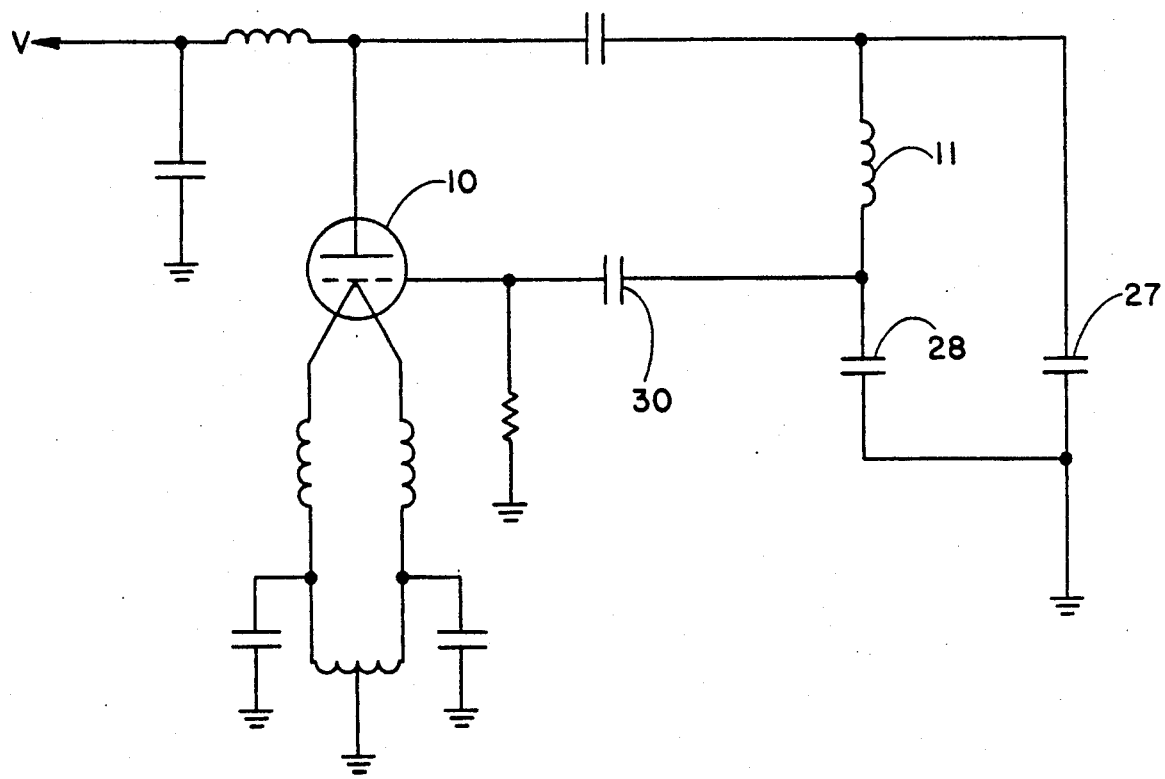
FIG. 1 is a circuit diagram of an oscillator for use with the instant invention.

An additive process for electrostatically depositing fine particles or powders of electrically conductive material in an electrical circuit pattern on a insulating substrate has been suggested in Soszek U.S. Pat. No. 4,698,907 and in an article by Soszek "How to Avoid Wet Processing" appearing in *Circuit's Manufacturing*, May, 1988, starting at page 21. Briefly, the Soszek process appears to closely parallel well-known xerographic techniques. It involves first producing a master pattern and then applying a conductive material in the form of powder or ink to the master pattern by electrostatic force followed by placing a nonconductive substrate close to the master pattern and then using electrostatic forces to transfer the particles from the master pattern onto the substrate in the desired pattern. When using the material in powdered form, according to Soszek, each particle must have a thin, nonconducting coating. While both the patent and the published article go on to mention the need to fuse the particles in order to complete a low resistant electrically conductive path, neither give any details as to how this can be accomplished. In order to fuse the metal powder into a continuous conductor, the temperature of the metal powder must be raised near or above the melting point of the metal. If the temperature is raised to slightly below the melting point, then the particles which are in contact with one another will slowly diffuse together in a manner which is called sintering. If the temperature is raised to the melting point or above, then the particles will flow together. However, the final shape of the molten or fused metal will depend upon the balance among a number of factors, including the surface tension, gravity, viscosity and circulating electrical currents. At the same time, in order to insure the integrity of the substrate, i.e., to make sure it isn't destroyed or severely damaged by heat, the metal particles must be fused and then cooled very quickly. The rate at which the energy to fuse the particles must be put into the metal particles is determined by the specific heat of the metal, its heat diffusion, and its melting point. An analysis of all these factors, in addition to the nature and characteristic of the substrate material, has led to the use of induction heating for fusing the metal particles. One reason is that induction heating produces only a small amount of direct heating of the substrate because the substrate is nonconducting whereas other suggested heating processes, such as lasers or infrared, directly heat the substrate as well as the metal particles.

The underlying principle of induction heating electrically conductive materials is that a rapidly changing magnetic field induces a current in the object being heated. Induction heating has been used with relatively large solid metal objects but a number of problems enter into the picture when dealing with micro-miniature particles of metal to melt or fuse them together. Both the magnitude of the magnetic field and the rate of change or frequency of the magnetic field are highly significant factors in the induction heating of micro-miniature particles. Induction heaters use a working coil as part of an oscillator circuit and to produce the varying magnetic field applied to the work piece. To produce a high magnitude intense magnetic field, large currents are needed in the work coil along with a high voltage in the oscillator circuit to produce the necessary energy for fusing. At high oscillating frequencies the resistivity of the conductors forming the coil windings increases thereby reducing the ability of the coil to carry the required high current. Even with an oscillator or signal generator which is capable of producing a magnetic field at a frequency and energy level theoretically great enough to fuse copper or other metal particles, it has been found that placing the copper particles even where the magnetic flux lines normally are most highly concentrated, e.g., at the end of or inside the coil core, results in little heating or melting or fusing of the particles. The reason for this is that because of the miniature size or "characteristic dimension" of the particles, very few of the flux lines of the magnetic field pass through or are intercepted by the individual particles. Therefore, the size or physical area of the magnetic field with respect to the particle size is another important factor to take into consideration in attempting to fuse fine particles. The flux lines should be concentrated so that a significant portion of the magnetic field flux lines are applied to or intercepted by the individual particles and/or small groups of particles. The characteristic dimension can be defined as the major dimension of the particles. Although in general the particles are not exactly alike, they do have a great deal of uniformity so there is not a great variance of the characteristic dimension amongst the particles. Typically it has been found that for the most part the particles are spherical and are similar in size so the diameter of the particle can be considered to be the characteristic dimension. On the one hand, the larger the size of the particles the less is the degree of concentration of the magnetic flux required to effect fusing, or, if the degree of flux concentration is maintained, lower frequencies can be used. On the other hand, the particles should be small enough so that they will be deposited and adhere in abundance when the circuit pattern is formed on the substrate. As a general guiding rule the particle diameter preferably should not be more than about one-eighth the width of the narrowest printed circuit conductor to be formed. For example, in a typical printed circuit board the conductors may be in the order of about 0.010 inch wide so the particles used to form the circuit by electromagnetic fusing should have a diameter of not more than about 0.00125 inch, although it may be considerably smaller.

A circuit diagram of a source for producing the high-frequency magnetic field suitable for fusing micro-miniature electrically conductive particles, is shown in FIG. 1. The circuit is a standard and conventional Colpitts oscillator using a commercially available vacuum tube 10 with suitable voltages applied to drive sufficient current through the tuned circuit made up of air core coil 11 and capacitors 27 and 28, and some distributed capacitance, for producing the oscillating magnetic field from coil 11 at the desired frequency for applying to the particles.

A number of factors come into play in trying to produce the intensity of the magnetic field at the high frequency necessary to provide the energy to fuse the particles. The ampere-turns of the coil windings is directly related to the magnitude of the flux produced and the voltage necessary to drive sufficient current through the coil windings increases in proportion to the frequency of oscillations and the inductance of the coil. The skin effect in the conductors which form the coil windings at these high frequencies creates resistance which must be overcome by the voltage to produce the desired current flow. It is necessary to provide a coil with low enough resistance and low enough inductance so that a practical level of voltage will produce the necessary current flow. At the same time the coil must have sufficient ampere-turns to produce the flux intensity necessary to fuse the metal particles. As a solution, coil 11 is in the form of a sheet coil, i.e., a thin strip or band or copper, 13, (or other suitable conducting material) would around itself with suitable separation or gap 14 between the coil windings to form the would coil. This utilizes the Litz principle which recognizes that high-frequency currents flow on the surface of a conductor so that conductors for carrying significant current at high frequencies should have a large surface area. The wound or coiled conductor may actually be multiple layers, for example three layers, of copper strips 13 which are coextensive and insulated from one another by a suitable insulating material 15 electrically attached together at each end so that each winding of the coil in fact may consist of multiple (three) thin strips which are electrically in parallel with one another to accommodate the high current flow. The coil windings are structurally supported vertically by insulative posts or rods, not shown, on a suitable horizontal insulative base, also not shown.

In the embodiment illustrated in the drawing, coil 11 has about three-and-one-half turns and is basically an air core coil so that all of the magnetic field flux lines pass through the core 16. At one end of core 16 is a flux concentrator, generally designated by reference number 17, which comprises a solid slab of copper 18 dimensioned to virtually completely close off one end of core 16 but with a very thin or narrow slit opening 19 at about the center of slab 18. The slit may be V-shaped in cross-section, i.e., tapered outward in the direction into the core and narrowing to a fine line or slit at the outer end of the core thereby contracting or concentrating the magnetic field into a very narrow beam running the length of the slit.

As illustrated in the drawings, as an example, a multitude of very fine particles of copper or copper powder 20 are layed out in a circuit pattern, generally designated by reference number 21, defining an electrical conductor on a suitable electrically insulative, non-magnetic substrate 22. The substrate 22 carrying the patterned copper particles 21 is placed over flux concentrator 17 and as it is moved across slit 19 through which the concentrated flux lines travel the high-frequency oscillating flux lines of the magnetic field act upon the particles which are in line with the slit with sufficient intensity to melt or fuse together the particles along slit 19 so as the substrate with the patterned copper particles completes its travel over the flux concentrator opening, the particles are formed into a homogeneous solid low-resistance electrical conductor.

There appears to be a relationship between the degree of concentration of the flux lines as provided by slit 19 in flux concentrator 17 and the characteristic dimension of the particles 20 to insure satisfactory fusing. In theory, the greater the degree of concentration, i.e., the closer the slit width is to the characteristic dimension of the particle, the greater is the fraction of the magnetic flux that is intercepted by each particle. However, there appears to be a range of slit width, relative to the particle size, which will satisfactorily fuse the particles from the conductor. It has been found that the slit width can be in the range of about one-half to ten times the width of the cross-section of the particle which is perpendicular to the flux lines at the slit. For the most part the particles tend to deposit on the substrate with the characteristic dimension generally parallel to the surface of the substrate, so the slit width should be on the order of one-half to ten times the characteristic dimension of the particles. The slit width not only affects the uniformity of fusing but it also affects the design of the high frequency power source.

Preferably the slit width should be such that one half to two thirds of the particle will be molten at any given time while the particles are passing through the concentrated magnetic field. This insures complete fusing while also insuring that the molten metal does not flow outside the boundaries of the circuit.

While the width of the slit is primarily determined by the particle dimensions, it also influences the requirements for the high frequency power source. The voltage required to drive the current needed to produce the magnetic flux depends upon the number of turns in the coil and the total flux passing through the bore of the coil. For melting at a given frequency each particle must intercept a certain minimum amount of flux. Since the particles are substantially uniform in area, this implies a minimum flux density (commonly called the magnetic field) in the slit. The flux concentrator causes substantially all of the magnetic flux in the bore of the coil to pass through the slit. Thus the total flux required to pass through the bore of the coil can be taken as the flux density times the area of the slit. The area of the slit will be determined primarily by its width because the length will depend upon the width of the substrate carrying the metal particles.

From the foregoing it follows that the operating voltage required from the high-frequency power source at a given frequency and a given coil design will generally be proportional to the width of the flux concentrator slit.

Although it was stated earlier that the preferable slit width should be the characteristic dimension of the particle and that the width can be as small as one-half the characteristic dimension, there are exceptions. It may be possible that if the slit is too small it may not allow sufficient magnetic field to be applied to the particles to create enough energy to cause fusing. On the other hand, for some unknown reason in some cases it may be possible to use a slit width considerably greater than ten times the characteristic dimension of the particle. Therefore, because of the interaction between the various elements some experimentation will likely be necessary for each application of the electromagnetic field fusing system to achieve satisfactory and/or optimum results.

A suitable cooling agent, such as cold water, cryogenic liquid or the like, is brought through tubes 24 and is circulated through the tubes in contact with the copper slab so that immediately adjacent the area of slit 19 the flux concentrator body is kept cool so that the heat imparted to the substrate is substantially limited to that in the area immediately surrounding slit 19. Although the temperature in this area may be quite high, it is applied to the substrate for a very short instant of time thereby minimizing any harmful overheating effect on the substrate.

The tubing 24 also may be used to support flux concentrator 17 or additional suitable support means for concentrator 17, not shown, may be provided.

As is well-known and commonplace in the art of heat treating or brazing metals, it is preferred that in order to avoid or limit oxidation a reducing agent should be used during the fusing process. The reducing agent may be in the form of a paste or powder both of which are widely used in the heat treating and brazing arts and so can be selected according to choice by one of ordinary skill in the art. Alternatively the fusing may be in a controlled atmosphere having a reducing agent in the form of a suitable gas, for example hydrogen or propane or the like or a combination having a preponderance of reducing agent gas with a small amount of inert gas. An example of this would be a controlled atmosphere having about 90% propane or the like and about 10% argon or similar. Reducing agent gases are also well-known in the art and the ordinarily-skilled artisan can select a suitable gas as a matter of choice. The area around the fusing and cooling zones may be provided with suitable shields and covers for confining the reducing agent gasses while permitting the free passage of the substrate and suitable means may be provided for safely removing any escaping gas.

A second identical suitably energized coil and flux concentrator having a magnetic field substantially the same frequency magnitude and phase as the earlier described apparatus can be placed above and in very close proximity to the patterned particles with the upper flux concentrator slit in line with the lower flux concentrator slit to apply fusing energy to the particles from above and below simultaneously. This expedites the fusing so that the substrate may be moved more rapidly across the flux concentrator and therefore be moved away from the area of most concentrated heat more quickly. As an added benefit, it then becomes somewhat easier to provide a reliable atmosphere of reducing agent gas in the fusing and cooling areas.

Also, it has been found that in some instances the interaction of the intense magnetic field and the current induced in the particles will cause some particles to lift off the substrate. This is due to the combined effect of Lenz's law and the gradient of the magnetic field.

Lenz's law states that the induced current will always flow in the direction that opposes the field that produced it. Thus the forces produced by induced currents will always try to move the conductor out of the magnetic field. This situation is more complicated when the magnetic field density is not uniform. When using two coils and flux concentrators, one above the other, the flux density is minimum mid-way between the two flux concentrators. When a particle is nearest the lower concentrator, the Lenz force causes it to move toward the upper concentrator. The magnetic field expands or spreads out as it leaves the lower concentrator and then converges again as it nears the upper concentrator. When the fields are resolved into their vector components there is a component of the field that is parallel to the flux concentrator. Near the lower concentrator this component is in one direction and near the upper concentrator this component is in the opposite direction. So near the lower concentrator this component of the magnetic field will interact with the induced current to produce a force that will tend to push the particle toward the mid plane. Near the upper concentrator this component of the magnetic field will interact with the induced current to produce a force that will tend to push the particle toward the mid plane. Counteracting the Lenz force which acts to move the particle away from the lower concentrator is the gradient force resulting from use of an upper concentrator. By approximately positioning the substrate between the two flux concentrators the particles are kept in place when the high-frequency magnetic field is applied.

Part of the foregoing description is concerned with controlling the amount of energy absorbed by the substrate from the molten metal to protect it from overheating. If the substrate should become severely damaged due to the elevated temperature, after the circuit has been formed the damaged substrate can be totally removed, if necessary, and the circuit placed on a different undamaged substrate.

An apparatus made and used in conformance with the teachings of this invention had a Litz conductor coil made up of three layers of copper sheets, each sheet about 0.075 millimeters thick by 75 millimeters wide which were insulated from one another by a film of Kapton of about 0.05 millimeters thick and electrically joined together only at their beginning and end edges and from there connected into the oscillator circuit. The total length of the Litz conductor was about 1500 millimeters. The Litz conductor was wound about itself to form a three-and-a-half turn coil, with each turn or winding of the coil adequately spaced from the adjacent winding and the coil having a central generally rectangular bore or air core measuring about twenty-five by one-hundred millimeters. One end of the core of the coil was closed with a slab of copper about eight millimeters thick, about twenty-five millimeters wide and about one-hundred millimeters long with a thin layer of insulation around the outside of the slab where it faced the coil windings. A centered beveled slit through the slab had a length of about seventy-five millimeters and a width at the top of the slab of about one and one-half millimeters and beveled outward to a width of about ten millimeters at the underside of the slab. The coil formed part of a tuned tank circuit of a Colpitts oscillator, FIG. 1. Coil 11 and capacitor 28 in series are in parallel with capacitor 27. The grid of vacuum tube 10 is capacitively coupled by capacitor 30 to the junction of coil 11 and capacitor 28. Otherwise the Colpitts oscillator is conventional with suitable choke coils, D.C. blocking capacitors, grid leak resistor and D.C. voltage applied to the plate of vacuum tube 10. Capacitors 27 and 28 are approximately thirteen picofarads each. The coil inductance with the flux concentrator in place was measured as approximately one and one-half microhenries and the resonant frequency of the tuned circuit was in the range of about twenty-five to about thirty megahertz. Vacuum tube 10 is a 6960 triode having typical operating parameters of plate voltage (v) of about 5000 volts and plate current of approximately 800 milliamperes. It was estimated that the RF voltage across the tuned circuit with the flux concentrator in place was about 2000 volts RMS and from this it was calculated that the coil current was about five amperes RMS, but due to uncertainty in measuring the coil inductance and the r.f. voltage, the coil current could have been significantly higher. Capacitor 30 was selected to provide minimum plate current at minimum grid current while still providing the required power for fusing. Capacitor 30 is approximately twenty-five picofarads.

Test specimens were made up of one to three layers of copper powder containing particles ranging in diameter from about forty microns to about eighty microns placed on a forty micron thick Kapton film. When placed over the flux concentrator the copper powder was heated to fusing temperature only in the area directly over the slit.

We claim:

1. A method for forming low resistivity particles into an electrical circuit, comprising the steps of:
   generating an intense highly-concentrated high-frequency electromagnetic field and applying said field to the low resistivity particles layed out in an electrical circuit pattern for fusing the particles together.

2. The method as in claim 1 wherein the field is applied by moving it across the patterned particles.

3. A method for making a low resistivity electrical circuit out of a multitude of miniature particles of low resistive material layed out in a contiguous electrical circuit pattern, comprising the steps of:
   generating a high-frequency electromagnetic field;
   concentrating the field to a narrow beam; and
   applying the concentrated field to the particles until they fuse together.

4. The method as in claim 3 wherein the particles have a characteristic dimension that ranges from about forty-five to about seventy-five microns.

5. The method as in claim 4 wherein the concentrated field beam width ranges in the order of about one-half to about ten times the characteristic dimension of the particles.

6. A method for forming a low resistivity electrical conductor, comprising the steps of:
   laying out a contiguous pattern of low resistivity miniature particles;
   generating a highly concentrated high frequency electro-magnetic field; and
   applying the concentrated electro-magnetic field to the particles until the particles fuse together.

7. A method for making a low-resistance electrical circuit, comprising the steps of:
   (a) placing a multitude of miniature particles of electrically conductive material on a flat surface of a carrier comprising a thin sheet of electrically insulative material in a pattern corresponding to the desired electrical circuit;

(b) generating an intense highly-concentrated high-frequency electro-magnetic field; and (c) applying the concentrated electro-magnetic field to the particles with the magnetic flux lines generally orthogonal to said flat surface of the carrier to fuse the particles together.

8. The method for making an electrical circuit as described in claim 7 wherein the concentrated electromagnetic field is applied to the underside of said flat surface of the carrier.

9. The method for making an electrical circuit as described in claim 7 wherein the concentrated electromagnetic field is applied simultaneously to the topside and the underside of said flat surface of the carrier.

10. The method for making an electrical circuit as described in claims 1, 3, 6 or 7 wherein the magnetic field is applied to the particles in a controlled atmosphere containing a reducing agent.

11. Apparatus for use in fusing together miniature metal particles, comprising:

an electrical oscillator having a multiwinding air core coil for producing a high-intensity high-frequency electromagnetic field, said multiwinding coil comprising a thin sheet of electrically conductive metal wrapped around itself with each wrap insulated from the other wraps;

a slab of electrically conductive material substantially closing off one end of the core; said slab having a very narrow opening therethrough for concentrating the electromagnetic field passing through the core into a very narrow beam; and means for applying said beam to a multitude of miniature metal particles to fuse together said particles.

* * * * *